United States Patent [19]

Faber

[11] Patent Number: 4,672,338

[45] Date of Patent: Jun. 9, 1987

[54] SAW FILTER HAVING RESPONSE ENHANCED VIA DAMPENING

[75] Inventor: Werner Faber, Kirchheim, Fed. Rep. of Germany

[73] Assignee: Siemens Aktiengesellschaft, Berlin and Munich, Fed. Rep. of Germany

[21] Appl. No.: 806,248

[22] Filed: Dec. 5, 1985

[30] Foreign Application Priority Data

Dec. 17, 1984 [DE] Fed. Rep. of Germany ....... 3446022

[51] Int. Cl.<sup>4</sup> ............................................. H03H 9/145
[52] U.S. Cl. .................................... 333/194; 333/151; 333/154
[58] Field of Search ............................. 333/150-155, 333/193-196; 364/82; 310/313 R, 313 A, 313 B, 313 C, 313 D; 29/25.35, 594; 331/107 A

[56] References Cited

U.S. PATENT DOCUMENTS

| 4,139,791 | 2/1979 | Yamada et al. | 333/150 X |
| 4,322,651 | 3/1982 | Inoue et al. | 310/313 C |
| 4,470,026 | 9/1984 | Buckinx et al. | 333/196 X |
| 4,472,694 | 9/1984 | Lee | 310/313 C X |
| 4,567,453 | 1/1986 | Schofield | 333/194 |
| 4,575,653 | 3/1986 | Sinha | 333/151 X |
| 4,604,594 | 8/1986 | Angerer et al. | 333/194 |

FOREIGN PATENT DOCUMENTS 0098599 1/1984 European Pat. Off. .

OTHER PUBLICATIONS

Abstract of Japanese Patent Document No. 57-13699, publication date Oct. 28, 1983.
Abstract of Japanese Patent Document No. 50-148875, Jun. 16, 1977.

Primary Examiner—Marvin L. Nussbaum
Attorney, Agent, or Firm—John Francis Moran

[57] ABSTRACT

An electrical surface acoustic wave filter with a wafer-shaped substrate (1) of monocrystalline, piezoelectric material, in particular lithium niobate, wherein one substrate side supports interdigital transducers (IW 1, IW 2) with metallic electrodes mutually engaging in comblike fashion for the stimulation and coupling out of the surface waves and with plastic and/or elastic damping compounds (10, 11) for the suppression of disturbing wave reflections. The damping compound (10, 11) is applied indirectly or directly to the substrate surface between the active interdigital transducer area "b" and the adjacent long substrate edges (4, 5) of at least one interdigital transducer (IW 1), and that at least in the inactive interdigital transducer areas (a, a).

9 Claims, 4 Drawing Figures

4,672,338

SAW FILTER HAVING RESPONSE ENHANCED VIA DAMPENING

BACKGROUND OF THE INVENTION

The invention relates to an electrical surface acoustic wave filter and, more particularly, to a filter having an improved out of passband suppression characteristic.

Surface acoustic wave (SAW) filters are known, for example, from the data book "Oberflaechenwellen-Filter LIOB" (Surface Wave Filter LIOB), issue 1983/84, published by Siemens AG of the Federal Republic of Germany. These SAW filters are integrated, passive components which have band filter characteristics that are function based on the interference of mechanical surface waves propagating along the surface of a piezoelectric material. The typical construction of SAW filters includes a moncrystalline, piezoelectric substrate, particularly an aluminum layer, such as by vapor deposition, piezoelectric input and output transducers, usually so-called interdigital transducers, formed into geometrical patterns by means of the photo etching technology. The interdigital transducers include several metallized, comblike electrodes, i.e. electrode with bus bars and fingers oriented perpendicular thereto and overlapping, in the active transducer areas, with respective interleaved fingers of the electrodes of different polarity. The substrate itself is glued to a metal carrier. Electrical connection between the input and output transducer and the terminals of the package for connection to external circuitry is typically accomplished via bond wires.

In operation, the surface acoustic wave filter converts an electrical signal applied to the input transducer into a mechanical surface wave which propogates on or in the substrate surface to the output transducer which then converts the surface wave back into an electrical signal with desired characteristics. The conventional transducers of the type referred to above have interdigital structures with transition time effects which could be provided with structures for shielding. Their properties are strongly frequency-dependent so that a filter effect for electrical signals is obtained due to the design of the structures.

The waves stimulated in the electrode overlapping areas of the interdigital transducers propagate not only in the desired propagation direction but, due to diffraction phenomena and due to the radiation distribution characteristic determined by the interdigital structures, also in the direction towards the edges of the substrate or chip. The waves traveling towards the short substrate edges are attenuated by conventional damping technology, using many different materials in particular photoresist and/or screen printing ink, applied to the respective substrate surface by the photoresist or screen printing method. The photoresist method has proven to be particularly well suited because the fine damping mass structures to be realized can be produced best rather conveniently with photolithographic techniques associated with photoresist.

SUMMARY OF THE INVENTION

The present invention is based on the task of providing a surface wave filter which, if necessary, attenuates or suppresses to a great extent, in addition to the conventional methods of attenuation, also those waves which travel in the direction toward the long substrate edges and are reflected at the transition of the transducer structure, especially at the transition from the electrode bus bars to the free substrate surface, as well as the long substrate edges.

To solve this problem, the invention provides, in an electric surface wave filter damping compound that is applied to the substrate surface indirectly or directly between the active interdigital transducer area (b) and the adjacent long substrate edges of at least one interdigital transducer, and at least a portion of the inactive interdigital transducer areas.

The damping compound, in particular photoresist and/or screen printing ink, is applied indirectly or directly to the substrate surface, preferably in strips parallel to the long substrate edges.

In addition to at least partial coverage of the inactive interdigital transducer areas, the damping coverage thus applied may also cover the electrode bus bars.

If the inactive interdigital transducer areas, i.e. the areas in which the electrode fingers of different polarity do not overlap, are not big enough to be coated with damping compound, these areas may be enlarged to suitable size by appropriately prolonging the electrode fingers.

If applicable, i.e. especially in cases in which the aforementioned enlargement of the inactive areas is undesirable, the damping compound may additionally cover also the active interdigital transducer areas adjacent to the inactive interdigital transducer areas; however, the covered area should maximally cover only about 10% of the active interdigital transducer area.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
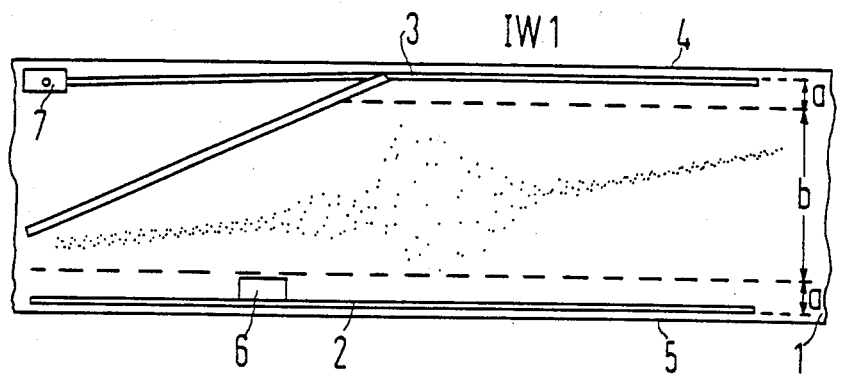
FIG. 1 shows, in diagrammatic, partly broken-off and simplified representation, a top view of an interdigital transducer of a surface wave filter according to the invention in which the active and the inactive interdigital transducer areas are indicated and only the mutually facing ends of the transducer fingers are shown for the sake of simplicity and clarity.
Figure 2:
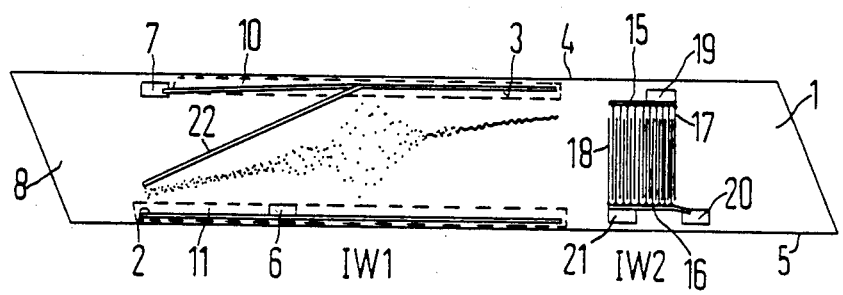
FIG. 2 shows, also in diagrammatical and partly simplified representation, a top view of a surface wave filter according to the invention with the interdigital transducer shown in FIG. 1 in larger scale.

The electric surface filter illustrated in FIGS. 1, 2 has a wafershaped substrate 1 of monocrystalline, piezoelectric material, namely lithium niobate. On one substrate side are located interdigital transducers IW 1 and IW 2 to stiumlate and couple out the surface waves. Both interdigital transducers comprise metallic structures such as those applied on the substrate through vapor deposition, their electrodes being in the form comblike structure and their electrode fingers 17, 18 overlapping or interleaved in the active interdigital transducer areas. The electrode fingers of the interdigital transducers are activated via bus bars 3, 22; 2 or 15, 16 and contact surfaces 7; 6 or 19; 20, 21, respectively. As indicated by broken lines in FIG. 2, damping compounds 10, 11, e.g. photoresist and/or screen printing ink, is applied to the substrate between the active interdigital transducer area "b" and the adjacent long substrate edges 4, 5 of the interdigital transducer IW 1.

In the illustrative embodiment of the invention each damping compound 10 or 11 covers an inactive interdigital transducer area a, a; i.e. an area in which the electrode fingers of different polarity, indicated only by their ends, do not overlap, and additionally the bus bars 3 and 2, respectively.

Figure 3:
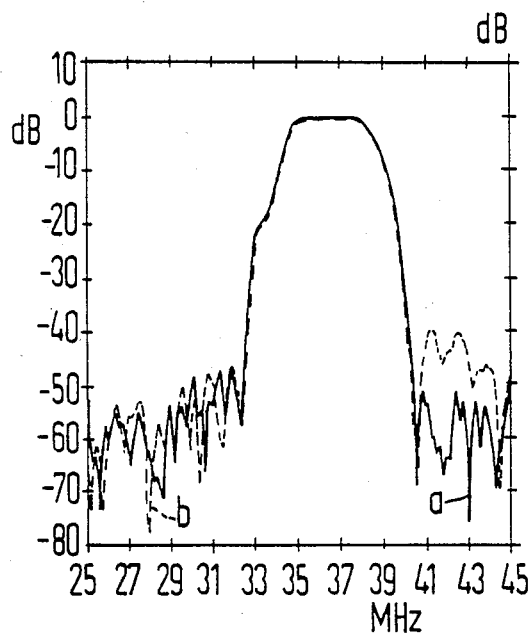
FIG. 3 illustrates a comparison of the amplitude response curves for a surface wave filter in accordance with FIGS. 1, 2, curve "a" representing a filter damped on the short and long substrate sides and curve "b" for a filter damped on the short substrate side only.
Figure 4:
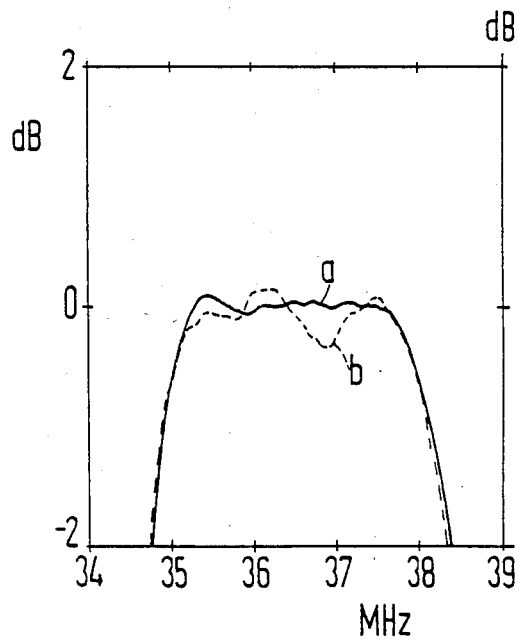
FIG. 4 depicts a portion of the conducting curves per FIG. 3 in larger scale to demonstrate the difference in sidelobe or ripple characteristics of the "fully damped" and of the only "partially damped" filter.

FIGS. 3, 4 depict for a surface wave filter according to FIGS. 1, 2, the filter transfer characteristics i.e. the frequency response of the amplitude plotted over the frequency, expressed in dB. "a" designates the response curve obtained with a filter damped along the short and the long substrate edges 8 and 4, 5 respectively; whereas curve "b" represent only those values obtained when the short substrate edge 8 only is damped.

It is clearly evident from FIG. 3 that the attenuation response characteristic of the filter is improved considerably by the damping according to the invention. Beyond this, it is clearly evident in the expanded scale response of FIG. 4 that the roof ripple is reduced considerably by employing the damping technique according to the invention.

There has thus been shown and described a novel arrangement for attenuating or suppressing undesired acoustic wave energy in SAW filters which fulfills all the objects and advantages sought therefor. Many changes, modifications, variation and other uses and applictions of the subject invention will, however, become apparent to those skilled in the art after considering the specification and the accompanying drawings which disclose embodiments thereof. All such changes, modification, variations and other uses and applications which do not depart from the spirit and scope of the invention are deemed to be covered by the invention which is limited only by the claims which follow.

I claim:

1. An electrical surface acoustic wave filter having a substrate in the shape of a polygon that is longitudinally elongated wherein longitudinal substrate edges are longer than the substrate transverse edges; the substrate comprising a monocrystalline, piezoelectric material, one side of the substrate including interdigital transducers spatially separated from each other, the interdigital transducers being used for the generation and output coupling of surface waves, the interdigital transducers comprising mutually engaging, comblike electrode fingers, metallic bus bars contacting these electrode fingers which overlap to define an active surface wave generating and/or sensing area while the remaining substrate area constitutes inactive surface wave area; and damping material for suppressing interfering reflected waves in the substrate, the damping material located in the form of strips parallel to the longitudinal edges in the inactive surface wave area between the longitudinal substrate edges and the active surface wave area, the damping material completely covering the bus bars of at least one of the interdigital transducers and at least one of the portions of the inactive surface wave areas adjacent thereto.

2. An electrical surface acoustic wave filter according to claim 1, wherein the damping material covers the entire area between these bus bars and the substrate edges adjacent thereto, and the active surface wave area corresponding to interdigital transducer area is further defined by the greatest overlap of the electrode fingers.

3. An electrical surface acoustic wave filter according to claim 1, wherein through the selection of a suitable electrode finger length, the overlap free and inactive surface wave area is made large enough to provide an adequate surface for the application of the damping compound.

4. An electrical surface acoustic wave filter according to claim 1, wherein the damping compound additionally covers the active surface wave area adjacent to the inactive surface wave area, but only to a maximum extent correspondingly approximately to 10% of the active surface wave area.

5. An electrical surface wave acoustic filter according to claim 1, wherein the damping material is photo resist material.

6. An electrical surface wave acoustic filter according to claim 1, wherein the damping material is screen printing lacquer.

7. An electrical surface wave acoustic filter according to claim 1, wherein the damping material is a combination of photo resist and screen printing lacquer.

8. An electrical surface wave acoustic filter according to claim 1, wherein the damping material is an elastic material.

9. An electrical surface wave acoustic filter according to claim 1, wherein the damping material is a combination of damping compounds.

* * * * *